United States Patent
Lenhard

(10) Patent No.: US 9,804,203 B2
(45) Date of Patent: Oct. 31, 2017

(54) COMPENSATION CURRENT SENSOR ARRANGEMENT

(71) Applicant: Vaccumschmelze GmbH & Co. KG, Hanau (DE)

(72) Inventor: Friedrich Lenhard, Hanau (DE)

(73) Assignee: VACUUMSCHMELZE GMBH & CO. KG, Hanau (DE)

( * ) Notice: Subject to any disclaimer, the term of this patent is extended or adjusted under 35 U.S.C. 154(b) by 355 days.

(21) Appl. No.: 14/258,217

(22) Filed: Apr. 22, 2014

(65) Prior Publication Data
US 2014/0312892 A1 Oct. 23, 2014

(30) Foreign Application Priority Data
Apr. 22, 2013 (DE) .......................... 10 2013 207 277

(51) Int. Cl.
*G01R 33/02* (2006.01)
*G01R 19/00* (2006.01)
*G01R 15/18* (2006.01)

(52) U.S. Cl.
CPC ....... *G01R 19/0092* (2013.01); *G01R 15/185* (2013.01); *G01R 33/02* (2013.01)

(58) Field of Classification Search
CPC ... G01R 19/0092; G01R 33/02; G01R 33/025
(Continued)

(56) References Cited

U.S. PATENT DOCUMENTS 3,932,813 A * 1/1976 Gallant ............... G01P 3/48
324/164

4,182,982 A * 1/1980 Wolf ............... G01R 15/146
323/357

(Continued)

FOREIGN PATENT DOCUMENTS

| DE | 19705767 A1 | 8/1998 |
| DE | 10052171 A1 | 5/2002 |
| EP | 0691544 A2 | 1/1998 |

OTHER PUBLICATIONS

Information Disclosure Statement for DE 102013207277.5 dated Nov. 21, 2013.

*Primary Examiner* — Tung X Nguyen
*Assistant Examiner* — Dominic Hawkins
(74) *Attorney, Agent, or Firm* — Dickinson Wright PLLC

(57) ABSTRACT

The current sensor arrangement according to the compensation principle has a primary conductor, designed to generate a primary magnetic field dependent on a current to be measured flowing through it, a first secondary winding, designed to generate a first secondary magnetic field dependent on a first compensation current flowing through said winding, a second secondary winding designed to generate a second secondary magnetic field dependent on a second compensation current flowing through said winding, a magnetic field sensor designed to generate a measurement signal that represents a magnetic field detected by it; a magnetic core of soft magnetic material designed and arranged to magnetically interconnect a primary conductor, a first seconding winding, a second secondary winding, and a magnetic field sensor; a first evaluation circuit, downstream from the magnetic field sensor and upstream from the first secondary winding, and a second evaluation circuit, upstream from the second secondary winding.

20 Claims, 5 Drawing Sheets

(58) Field of Classification Search
USPC ................ 324/244, 227, 228, 246, 247, 248
See application file for complete search history.

(56) References Cited

U.S. PATENT DOCUMENTS

| | | | | |
|---|---|---|---|---|
| 5,565,765 | A * | 10/1996 | Lenhard | G01R 15/185 324/117 R |
| 7,701,201 | B2 * | 4/2010 | Zapf | F16H 59/105 324/207.17 |
| 2002/0093366 | A1 * | 7/2002 | Fotouhi | H03K 19/00315 327/108 |
| 2006/0158166 | A1 * | 7/2006 | Van Der Wal | H02M 7/53803 323/282 |
| 2007/0252577 | A1 * | 11/2007 | Preusse | G01R 15/185 324/117 R |
| 2009/0039869 | A1 * | 2/2009 | Williams | H01L 23/49575 324/123 R |
| 2011/0221436 | A1 * | 9/2011 | Ichinohe | G01R 15/205 324/252 |
| 2011/0227560 | A1 * | 9/2011 | Haratani | B82Y 25/00 324/117 R |
| 2012/0236447 | A1 * | 9/2012 | Mack | H02H 9/046 361/56 |
| 2013/0127581 | A1 * | 5/2013 | Odehnal | H01F 27/289 336/84 R |
| 2014/0009146 | A1 * | 1/2014 | Blagojevic | G01R 33/04 324/252 |
| 2014/0184186 | A1 * | 7/2014 | Glaser | H01F 27/362 323/282 |

* cited by examiner

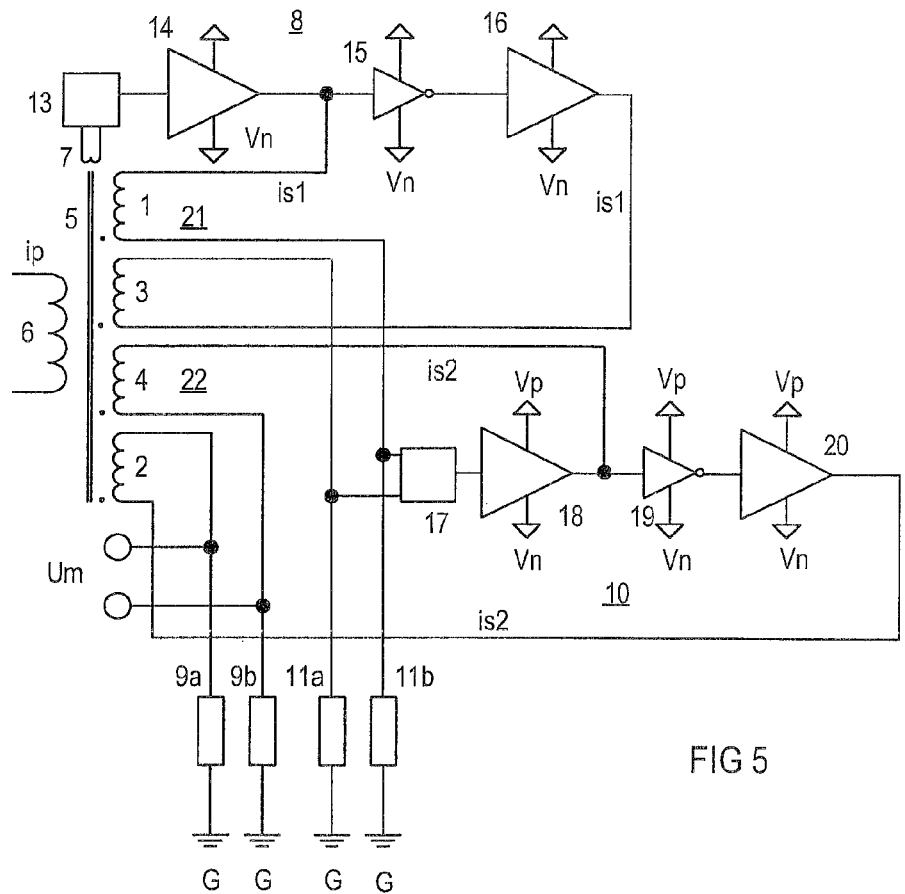
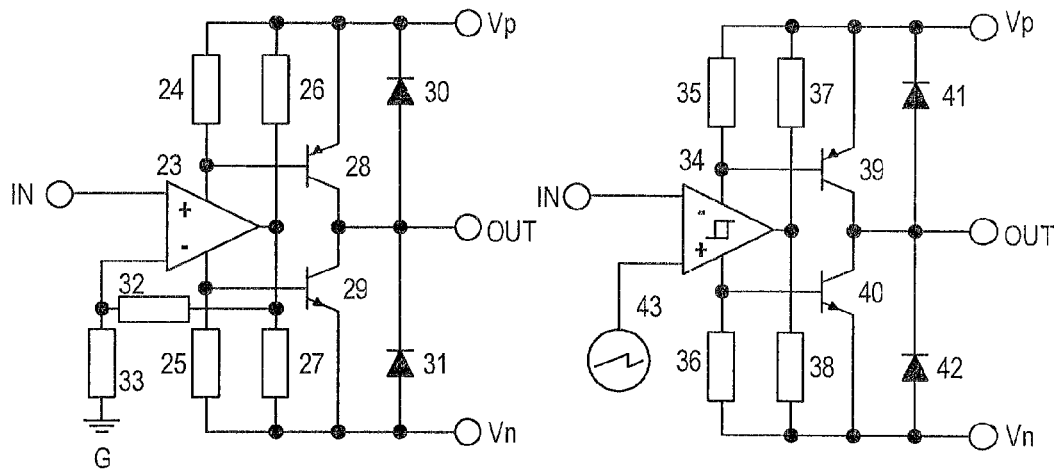
FIG 5
FIG 6
FIG 7

COMPENSATION CURRENT SENSOR ARRANGEMENT

This application claims benefit of the filing date of DE 10 2013 207 277.5, filed 22 Apr. 2013, the entire contents of which are incorporated herein by reference for all purposes.

BACKGROUND

1. Field

Disclosed herein is a current sensor arrangement according to the compensation principle.

2. Description of Related Art

Current sensor arrangements serve to determine the electric current strength of a current to be measured and are special instrument transformers that are operated according to various principles. Current sensor arrangements operating according to the compensation principle, also known as compensation current sensor arrangements or compensation current sensors for short, generally have a magnet core of a soft magnetic material, which encloses a primary conductor carrying the current to be measured. The current to be measured flows through the primary conductor and generates a (primary) magnetic field in the magnetic core, which is compensated by a (secondary) magnetic field generated by a compensating current in a secondary winding wrapped around the core. To this end, the magnetic flux in the magnetic core is measured by means of a magnetic field sensor and adjusted to zero using an evaluation circuit, whereby a suitable compensation current is fed into the compensation winding, which, when the resulting magnetic flux in the magnetic core is zero, is proportional to the primary current to be measured.

SUMMARY

However, during the operation of such compensation current sensors, brief peak currents may occur that are significantly above the rated current (continuous current). In conventional compensation current sensors, the ratio of permissible peak current to rated current is less than two. However, often a ratio greater than two, frequently also greater than three is advantageous. However, in doing so and to have minimum power loss, the turn ratio is to be high, for example 1:5,000. A corresponding improvement of known compensation current sensors is therefore desirable.

This is achieved by means a current sensor arrangement according to the compensation principle. The arrangement has a primary conductor that is designed to generate a primary magnetic field dependent on a current to be measured flowing through it. Also provided are a first secondary winding that is designed to generate a first secondary magnetic field dependent on a first compensating current flowing through said winding and a second secondary winding that is designed to generate a second secondary magnetic field dependent on a second compensation current flowing through said winding. The arrangement also has: a magnetic field sensor that is designed to generate a measurement signal that represents a magnetic field measured by it; a magnetic core of a soft magnetic material that is designed and arranged to magnetically interconnect a primary conductor, a first secondary winding, a second secondary winding, and a magnetic field sensor; a first evaluation circuit downstream from the magnetic field sensor and upstream from the first secondary winding, said circuit being designed to generate a first compensation current corresponding to the measurement signal of the magnetic field sensor and thereby feed the first secondary winding; and a second evaluation circuit upstream from the second secondary winding, said circuit being designed to generate a second compensation current corresponding to the first compensation current and thereby feed the second secondary winding. In doing so, the magnetic field measured by the magnetic field sensor is the magnetic field resulting from the superposition of the primary magnetic field, first secondary magnetic field and the second secondary magnetic field in the magnetic core. The first compensation current and the second compensation current are adjusted by the first evaluation circuit and the second evaluation circuit in such a manner that the resulting magnetic field recorded by the magnetic field sensor becomes zero. The second compensation current is greater or smaller than the first compensation current and represents the current to be measured flowing in the primary conductor.

BRIEF DESCRIPTION OF DRAWINGS

Embodiments of the invention are explained in further detail below using the embodiments depicted in the figures of the drawing, wherein identical elements are furnished with the same reference signs.

FIG. 5 depicts in a wiring diagram a fourth sample design of the compensation current sensor according to FIG. 1 with two drivers in a full bridge circuit and four measurement resistors leading to a ground and each switched in pairs between two partial windings of the two secondary windings.

FIG. 6 depicts in a wiring diagram a sample linear driver that generates a linear output voltage depending on the input voltage.

FIG. 7 depicts in a wring diagram a sample pulsed driver that generates a pulse width-modulated output voltage dependent on the input voltage.

DETAILED DESCRIPTION OF SPECIFIC EMBODIMENTS

Figure 1:
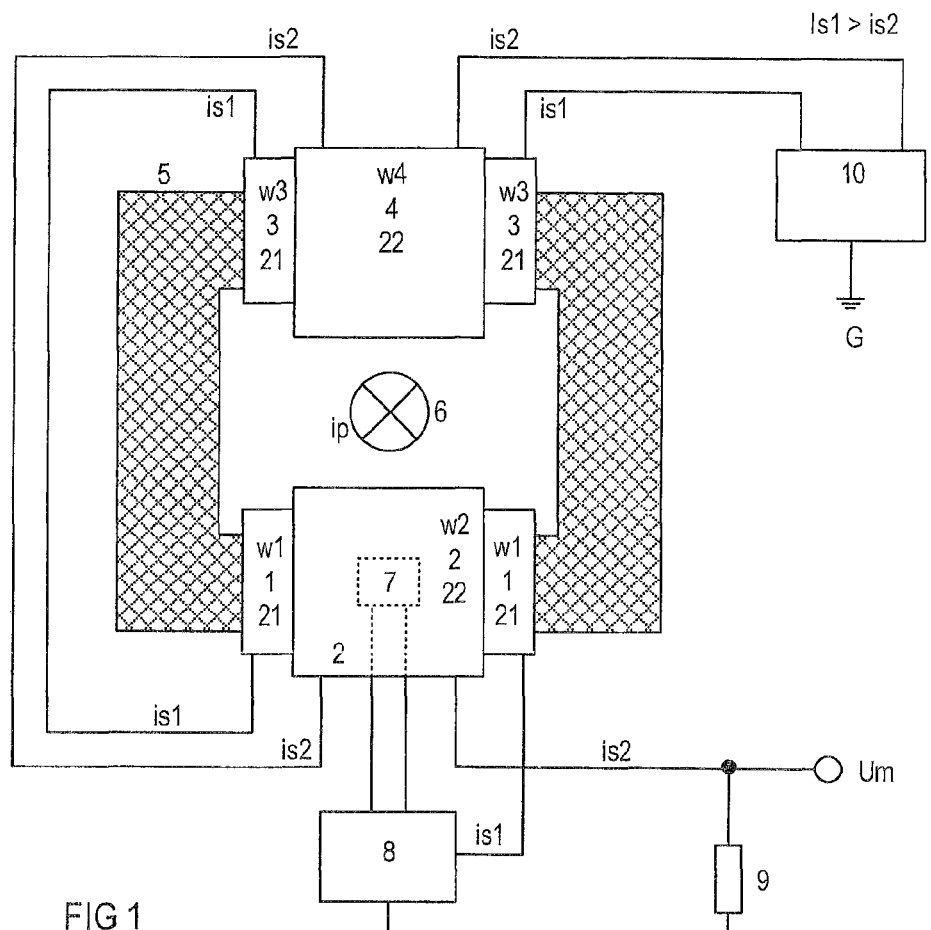
FIG. 1 depicts a simplified schematic illustration of the mechanical structure and the electrical wiring of a compensation current sensor with two improved compensation windings for example purposes.

FIG. 1 depicts in a schematic illustration an example of an improved compensation current sensor. The compensation current sensor has four windings 1, 2, 3, and 4, which are wound on an enclosed magnetic core 5 of soft magnetic material such as iron or an iron alloy. In the present case, magnetic core 5 has the shape of a ring core of a rectangular basic structure and a rectangular cross-section (not apparent from FIG. 1). Magnetic core 5 has due to its rectangular basic structure four arms of which two opposing arms are equipped with two of the windings 1, 2, 3, and 4. Accordingly, windings 1 and 2 are wound around one of these two arms, while windings 3 and 4 are wound around the other of these two arms. To this end, windings 1 or 3 are initially applied on the two arms in question, on which then windings 2 or 4 are wound on top of these. Windings 1 and 3 are electrically switched in series and together form a first secondary winding 21. Accordingly, windings 2 and 4 are electrically switched in series and together form a second secondary winding 22.

Instead of magnetic core 5 with a rectangular basic structure and a rectangular cross-section, any shapes can be used for the basic structure and cross-section, such as round (cf. FIG. 9), oval, square, or polygonal basic structures and cross-sections, as long as the basic structure of magnetic core 5 is a closed form with a central opening. A closed basic structure means that the central opening completely encloses the small gap relative to the circumference of the central opening or encloses it to a narrow air gap relative to the total circumference of the magnetic core. Accordingly, any combinations of various basic structures and cross-sections of magnetic core 5 are possible. In addition, instead of windings 1 and 2 or 3 and 4 wound on top of each other respectively, windings wound into each other or along the magnetic core circumference in alternating sections may be provided.

Through the central opening of magnetic core 5, a primary conductor 6 is guided essentially in a linear manner, in which a current to be measured, hereinafter referred to as primary current ip, flows. Instead of guiding primary conductor 6 in a more or less linear manner through the central opening, it can also be wound as an additional winding, in other words as primary winding, around magnetic core 5.

In addition, a magnetic field sensor 7 is provided, which in the present case is housed in a recess closed on almost all sides in magnetic core 5 under winding 1. As a magnetic field sensor 7, one can use for example electromagnetically functioning sensors, which in the simplest case themselves only consist of a winding, or semiconductor sensors using the so-called Hall effect. Magnetic field sensor 7 can alternatively also be arranged on magnetic core 5 on an outwardly opening indentation or if an air gap is present in it.

Downstream from magnetic field sensor 7 is a first evaluation circuit 8, which prepares a measurement signal delivered by magnetic field sensor 7 and provides a current corresponding to it. This current represents compensation current is1 and is controlled by magnetic field sensor 7 in connection with the first evaluation circuit 8 in such a manner that the resulting magnetic flux in magnetic core 5 is almost zero and is thus proportional to primary current ip. Compensation current is1 is led through the electrical series circuit of winding 1 and winding 3 (first secondary winding 21) and the input circuit of a second evaluation circuit 10 to ground G (reference potential). Evaluation circuit 10 thereby measures the first compensation current is1 and generates proportional to the first compensation current is1 a second compensation current is2, which is led through the electrical series circuit of winding 2 and winding 4 (second secondary winding 22) and an ohmic resistor 9 switched in series to ground G. The second compensation current is2 is proportional to the first compensation current is1 and is smaller than it. Based on the proportionality to the first compensation current is1, it also represents the current to be measured flowing in the primary conductor, the primary current ip. Consequently via resistor 9, a voltage Um can be tapped that is proportional to the second compensation current is2, which is in turn proportional to the first compensation current is1 and thus proportional to the primary current ip to be measured.

The turn number w21 of the first secondary winding 21 is thereby higher than turn number w22 of the second secondary winding 22 (w21>w22). Since in the present example, first and second secondary windings 21, 22 are each formed from two identical (partial) windings 1, 3 and 2, 4 respectively, it is provided that windings 1 and 3 have among each other the same turn numbers w1=w3=0.5·w21 and windings 2 and 4 have among each other the same turn numbers w2=w4=0.5·w22. The turn direction of windings 1 to 4 is thereby of such a type that in connection with the currents flowing through them, they generate rectified magnetic fluxes in magnetic core 5. In addition, the wire thicknesses of the two secondary windings 21 and 22 may each be selected in such a manner that the current densities in both are (approximately) equal.

Figure 2:
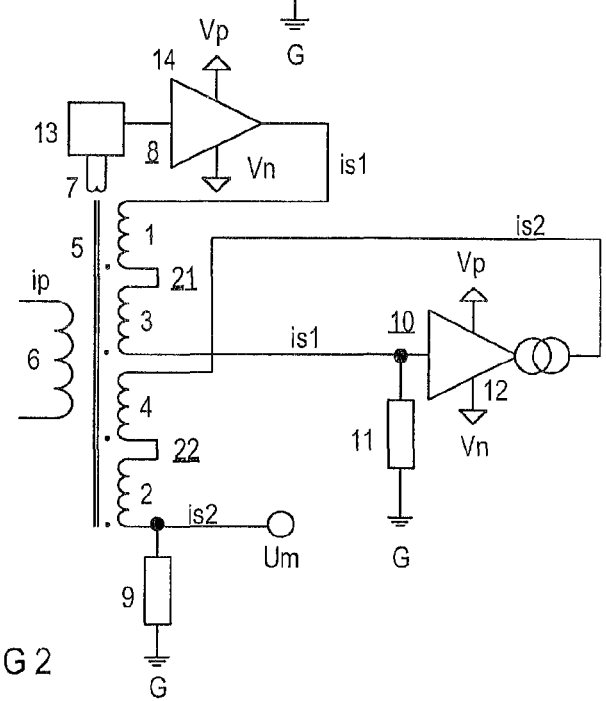
FIG. 2 depicts in a wiring diagram a first sample design of the compensation current sensor according to FIG. 1 with one driver for each of the compensation windings.

FIG. 2 depicts in a wiring diagram for example purposes a possible electrical wiring advancement of the compensation current sensor according to FIG. 1. Accordingly, primary current ip to be measured is led through primary conductor 6 that is depicted as a primary winding in the example shown in FIG. 2. With primary conductor 6, the first secondary winding 21 and the second secondary winding 22 are magnetically coupled to each other via the magnetic core 5. The magnetic flux in magnetic core 5 is measured by magnetic field sensor 7 and evaluated by means of the first evaluation circuit 8, which, depending on that, generates the first compensation current is1. It is then passed through the first secondary winding 21 to the second evaluation circuit 10, which from that as explained above generates the second compensation current is2. The second compensation current is2 is passed through the second secondary winding 22 as well as resistor 9 placed in series thereto. The voltage drop Um caused by the second compensation current is2 at resistor 9 then forms the output variable, i.e., the variable representing primary current ip.

In the present example, the evaluation circuit is formed by a differential input stage 13, which is downstream from magnetic field probe 7 and generates from the floating output signal of magnetic field probe 7 a corresponding output signal—in this case an output voltage—relative to ground G. Input stage 13 is designed in a conventional manner corresponding to the respectively used magnetic field sensor type (for example a Hall sensor or magnetic sensor) so that their design will not be addressed in further detail herein. However, input stage 13 is distinctive in that it emits a signal, particularly a proportional one, representing a magnetic flux appearing at it. This can for example be a voltage proportional to the magnetic flux as is established for further considerations; however any other suitable variable can be used, such as current, frequency, duty cycle, or also correspondingly coded digital signals such as binary words.

The output signal of differential input stage 13 is supplied to a driver amplifier 14, which, depending on the design, generates an output voltage sufficient for actuating the first secondary winding 21 or an output current sufficient to do so. The example according to FIG. 2 pertains to a voltage-voltage amplifier, however a voltage-current amplifier can be used in the same manner. Driver amplifier 14 may supply a unipolar output voltage or a unipolar output current or a bipolar output voltage or a bipolar output current, depending on the application. A unipolar output voltage or a unipolar output current thus only have one polarity, while a bipolar output voltage or a bipolar output current may have two opposite polarities.

Driver amplifier 10 comprises an ohmic resistor 11 connected to ground G as well as a driver amplifier 12 controlled by the voltage via resistor 11. In this case, driver amplifier 12 is designed as a voltage-current amplifier; however a correspondingly dimensioned voltage-voltage amplifier can be used in the same way. Driver amplifier 14 may supply a unipolar output voltage or a unipolar output current or a bipolar output voltage or a bipolar output current, depending on the application. In the depicted situation, the first compensation current is1 is transformed by means of resistor 11 into a voltage proportional hereto and this voltage is in turn transformed by driver amplifier 12 into a proportional current, the second compensation current is2. Resistor 11 and driver amplifier 12 together form a current-controlled power source (with an amplification less than one), such as a current-current amplifier or a current mirror, in which the output current and input current are in a certain ratio to each other. Since in this case, the output current of such a current-current amplifier or current mirror is equal to the second compensation current is2 and its input current is equal to the first compensation current is1, wherein the first compensation current is1 is greater than the second compensation current is2, the following correlation results:

$$is1 = x \cdot is2,$$

where x>1.

Accordingly, x>1.2, or x>1.5 or x>2.

When using a voltage-voltage amplifier instead of the depicted voltage-current amplifier, it and resistor 11 shall be dimensioned in such a manner that the second compensation current is2 is smaller than the first compensation current is1. This can take place in a simple manner for example by the corresponding dimensioning of resistor 11. Instead of the voltage across resistor 11, the voltage at the output of driver amplifier 14 could also be used to control driver amplifier 12.

When using driver amplifiers 12 and 14 supplied from bipolar supply voltage sources, i.e., out of two voltage sources switched in series with opposing polarities, driver amplifiers 12 and 14 can be operated inversely to each other to somewhat evenly load the supply voltage sources with opposing polarities so that the second compensation current is2 is always drawn from the supply voltage source with the polarity opposite to that which is supplied by the first compensation current is1.

Furthermore, it can be provided that the wire thicknesses of both compensation windings 21 and 22 are each configured in such a way that the current densities in both compensation windings 21 and 22 are approximately equal during operation. Even though it is possible in a similar manner to tap the output voltage Um via resistor 11 in the electric circuit of the first compensation current is1, in the depicted ones it is tapped via resistor 9 in the electric circuit of the second compensation current is2. In this way, a virtual turns ratio can be generated that is significantly smaller than the nominal turns ratio. The nominal turns ratio results from turn number wp of the primary winding as well as turn numbers w1, w2, w3, and w4 of the secondary (partial) windings 1, 2, 3, and 4 as follows:

$$N = wp/(w1+w2+w3+w4) > Nv,$$

Whereas the virtual turns ration Nv still undergoes a reduction, which is definitively determined by the ratio of the first compensation current is1 to the second compensation current is2. In doing so, the primary-side ampere turn number and the sum of the secondary-side ampere turn numbers compensate each other:

$$ip \cdot wp = is1 \cdot (w1+w3) + is2 \cdot (w2+w4).$$

Figure 3:
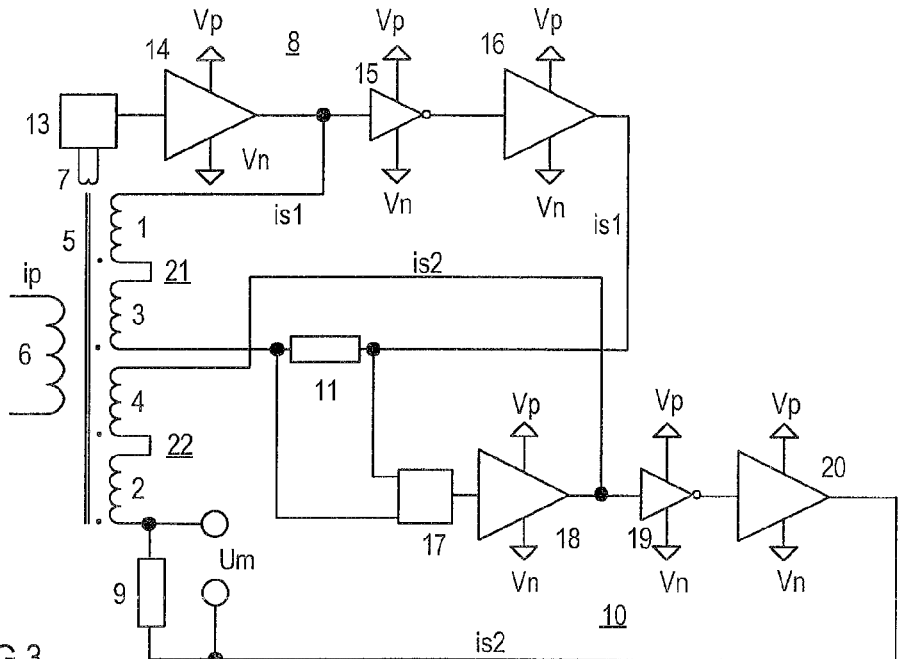
FIG. 3 depicts in a wiring diagram a second sample design of the compensation current sensor according to FIG. 1 with two drivers in a full bridge circuit and two measurement resistors in series to the two secondary windings.

The circuit depicted in FIG. 2, including all variation possibilities described above, can furthermore also be implemented with full bridge circuits, instead of half-bridge circuits as they are frequently used in connection with bipolar-supplied driver amplifiers. A corresponding example is depicted in FIG. 3. Compared to the circuit depicted in FIG. 2, there is downstream from driver amplifier 14 via inverter 15 a driver amplifier 16 identical to driver amplifier 14. Instead of the combination of inverter 15 and driver amplifier 16, one could also similarly use an inverting driver amplifier. Due to the interposition of inverter 15, there are at the outputs of driver amplifiers 14 and 15 inverse, i.e., counter-phase, output signals. If now the first secondary winding 21 is switched (full bridge circuit) between the outputs of driver amplifiers 14 and 15, then the voltage present at it doubles in relation to a half-bridge circuit (as in the circuit according to FIG. 2) and consequently, assuming a constant load, also the current generated thereby.

However, the series circuit of a first secondary winding 21 and resistor 11 is no longer referenced to ground G, but "hangs" in a floating manner between the outputs of the driver circuits 14 and 16. To this end in the example depicted in FIG. 3, resistor 11 is connected directly to the output of driver amplifier 16 and, upon interposition of the first secondary winding 21, connected to the output of driver amplifier 14. In the example depicted in FIG. 4, partial winding 3 is connected directly to the output of driver amplifier 16 and partial winding 1 is connected directly to the output of driver amplifier 14. The two partial windings 1 and 3 are connected to each other via resistor 11. In the examples according to FIGS. 3 and 4, the floating voltage across resistor 11 is detected by a differential input stage 17 and supplied as a hereto corresponding output voltage referenced to ground G to a driver amplifier 18. There is downstream from driver amplifier 14 via inverter 15 a driver amplifier 16 identical to driver amplifier 14.

In the present case, all driver amplifiers 14, 16, 18, and 20 are designed identically; however, other combinations, up to and including four different driver amplifiers are similarly possible. In the example depicted in FIG. 3, resistor 9 is connected directly to the output of driver amplifier 20 and, upon the interposition of the second secondary winding 22, connected to the output of driver amplifier 18. In the example depicted in FIG. 4, partial winding 4 of the second secondary winding 22 is connected directly to the output of driver amplifier 20 and partial winding 2 is connected directly to the output of driver amplifier 18. Both partial windings 2 and 4 are connected to each other via resistor 9. In both examples according to FIGS. 3 and 4, voltage Um is tapped in a floating manner across resistor 9.

Figure 4:
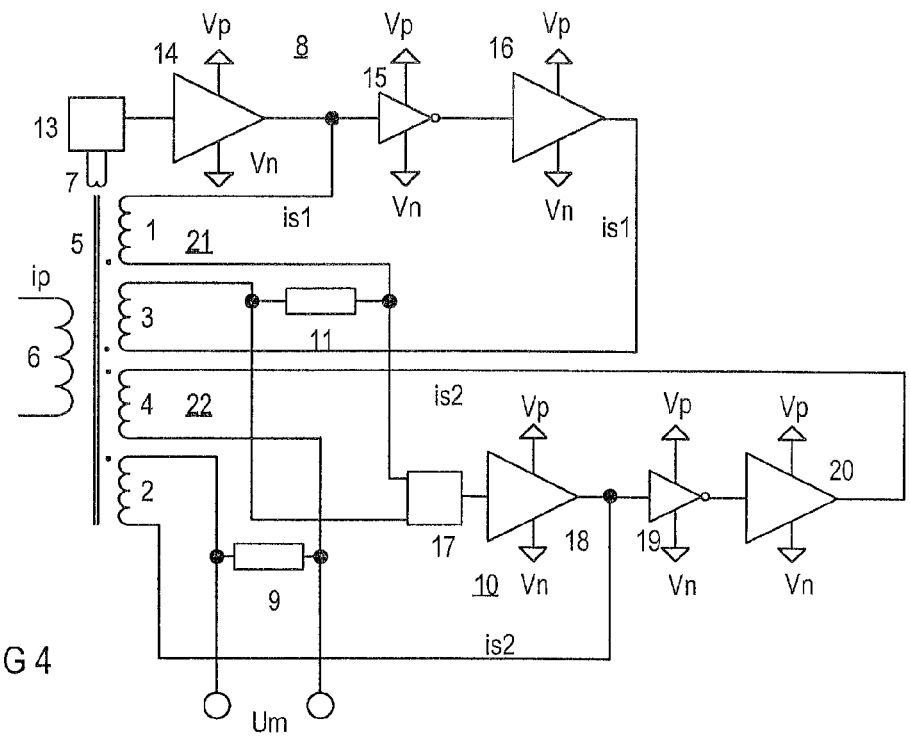
FIG. 4 depicts in a wiring diagram a third sample design of the compensation current sensor according to FIG. 1 with two drivers in a full bridge circuit and two measurement resistors each switched between two partial windings of the two secondary windings.

In the example according to FIG. 4, the turn direction of both partial windings 2 and 4 is reversed in relation to partial windings 1 and 3, since the actuation of partial windings 2 and 4 is reversed in relation to partial windings 1 and 3, i.e., partial windings 2 and 4 are actuated with inverse voltages in relation to the example according to FIG. 3. One shall note the deviating circuitry of the outputs of driver amplifiers 18 and 20 to the second compensation winding 22.

Based on the example shown in FIG. 3, the circuit of the compensation current sensor depicted in FIG. 5 is changed to the effect that resistors 9 and 11 are each designed as resistor pairs with the pair-wise identical resistors 9a, 9b and 11a, 11b respectively, which are all led on the one hand to ground G and on the other are each connected to a connection of windings 2 and 4 or windings 1 and 3. The other connection of winding 1 is connected to the output of driver amplifier 14, the other connection of winding 3 is connected to the output of driver amplifier 16, the other connection of winding 4 is connected to the output of driver amplifier 18, and the other connection of winding 2 is connected to the output of driver amplifier 20. The connections wired to resistors 9a, 9b and 11, 11b are the connections facing each other of windings 1 and 3, and 2 and 4 respectively, so that here the wiring of the first and second compensation windings 21, 22 is similar to the wiring shown in FIG. 4, with the exception that resistors 9 and 11 are equipped so to say with a tap placed at ground G. The tap here is formed in each case by the nodal point of resistors 9a and 9b, and 11a and 11b respectively. Accordingly, the corresponding voltages are each taken via the series circuits of resistors 9a and 9b, and 11a and 11b respectively.

FIG. 6 depicts in a wiring diagram an example of a linear driver amplifier that can be used for example as driver amplifier 14, 16, 18, and 20. The core of the linear driver amplifier depicted there forms an operational amplifier 23 that is supplied via a resistor 24 by the positive supply voltage Vp and via a resistor 25 by the negative supply voltage Vn. The output of operational amplifier 23 is connected via a resistor 26 to the positive supply voltage Vp and via a resistor 27 to the negative supply voltage Vn. Serving as an output stage are a pnp bipolar transistor 28 and a npn bipolar transistor 29, whose collectors are connected to each other and to the output OUT of the driver amplifier. Transistor 28 is connected by means of its emitter to the positive supply voltage Vp and connected by means of its base to the node of resistor 25 and operational amplifier 23. Output OUT is protected against incorrectly poled voltages appearing at it by means of two diodes 30 and 31, which lead from output OUT to positive supply voltage Vp and to the negative supply voltage Vn respectively. Operational amplifier 23 is counter-coupled by a voltage divider, having two resistors 32 and 33, which is switched between the output of operational amplifier 23 and ground G, by the tap of the voltage divider, i.e., the nodal point between resistors 32 and 33, being connected to the inverting input of operations amplifier 23. The non-inverting input of operational amplifier 23 forms the input IN of the driver amplifier. Instead of bipolar transistors, (MOS) field effect transistors can be used in a similar manner.

Alternatively to a linear driver amplifier described above in relation to FIG. 6, a pulsed driver amplifier can also be used, whose output voltage can be changed by pulse width modulation for example. From the pulsed voltage and using a low pass, which is formed in this case by an RL element comprising the inductivity of the respective compensation winding 21 or 22, and their respective resistors 9 or 11, is implemented into linear voltage changes. An example of such a pulse width-modulated driver amplifier is depicted in FIG. 7. The core of the pulse width-modulated driver amplifier shown there is formed by a comparator 34 (for example with hysteresis), which is supplied via a resistor 36 from the positive supply voltage Vp and via a resistor 36 from the negative supply voltage Vn. The output of comparator 34 is connected via a resistor 37 to the positive supply voltage Vp and via a resistor 28 to the negative supply voltage Vn. Serving as output stages are a pnp bipolar transistor 39 and an npn bipolar transistor 40, whose collectors are connected to each other as well as with the output OUT of the driver amplifier. Transistor 39 has its emitter connected to the positive supply voltage Vp and has its base connected to the junction point of resistor 35 and comparator 34. Accordingly, transistor 40 has its emitter connected to the negative supply voltage Vn and its base connected to the node of resistor 36 and comparator 34. Output OUT is protected by means of two diodes 41 and 42, which lead from output OUT to positive supply voltage Vp and negative supply voltage Vn respectively, against any incorrectly poled voltages appearing at it.

Comparator 34 receives at its inverting input a triangle-shaped reference voltage from reference voltage source 43 in relation to ground G. The non-inverting input of comparator 34 forms the input IN of the driver amplifier. Here too, (MOS) field effect transistors can be used without problems instead of the bipolar transistors.

The driver amplifiers depicted in conjunction with FIGS. 6 and 7 generate an output voltage dependent on the input voltage (voltage-voltage amplifier). However, in the same way, voltage-current amplifiers, in other words amplifiers whose output current is dependent on the input voltage, can be used in a similar manner. Such a driver amplifier is used for example as driver amplifier 12 in the circuit depicted in FIG. 2; however, it can be used in any of the other driver amplifiers 14, 16, 18, and 20 depicted in FIGS. 3, 4, and 5. An example of a driver amplifier designed as a voltage-current amplifier is depicted in FIG. 8.

Figure 8:
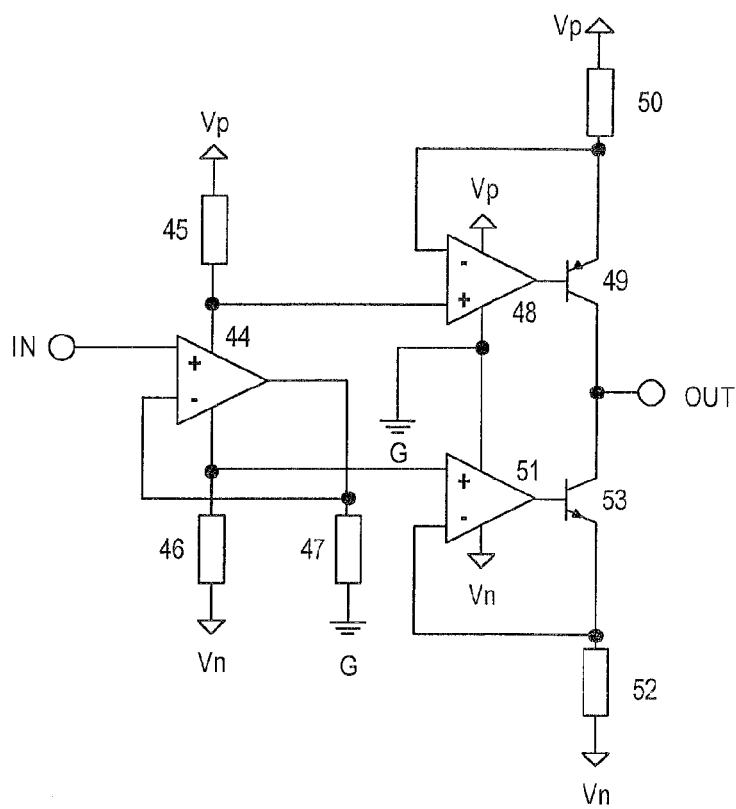
FIG. 8 depicts in a wiring diagram a sample linear driver that generates a linear output current dependent on the input voltage.

The driver amplifier illustrated in FIG. 8 comprises an operations amplifier 44, which is supplied via a resistor 45 from the positive supply voltage Vp and via a resistor 46 from the negative supply voltage Vn. The output of operations amplifier 44 is on the one hand connected directly to its inverting input and on the other via a resistor 47 to ground G. In addition, two operations amplifiers 48 and 51 are provided whose non-inverting input is connected to the nodal point between resistor 45 and operations amplifier 44, and to the nodal point between resistor 46 operations amplifier 44. Operations amplifier 48 has its supply lines directly connected to positive supply voltage Vp and ground G, while operations amplifier 51 has its supply lines connected directly to negative supply voltage Vn and ground G.

Connected to the output of operations amplifier 48 is the base of a pnp bipolar transistor 49, whose emitter is connected directly to the inverting input of the operations amplifier 48 and, by the interposition of a resistor 50, is connected to positive supply voltage Vp. Connected to the output of operations amplifier 51 is the base of a npn bipolar transistor 53, whose emitter is connected directly to the inverting input of the operations amplifier 51 and, by the interposition of a resistor 52, is connected to negative supply voltage Vn. The collectors of transistors 49 and 53 are interconnected and form output OUT of the driver amplifier.

Figure 9:
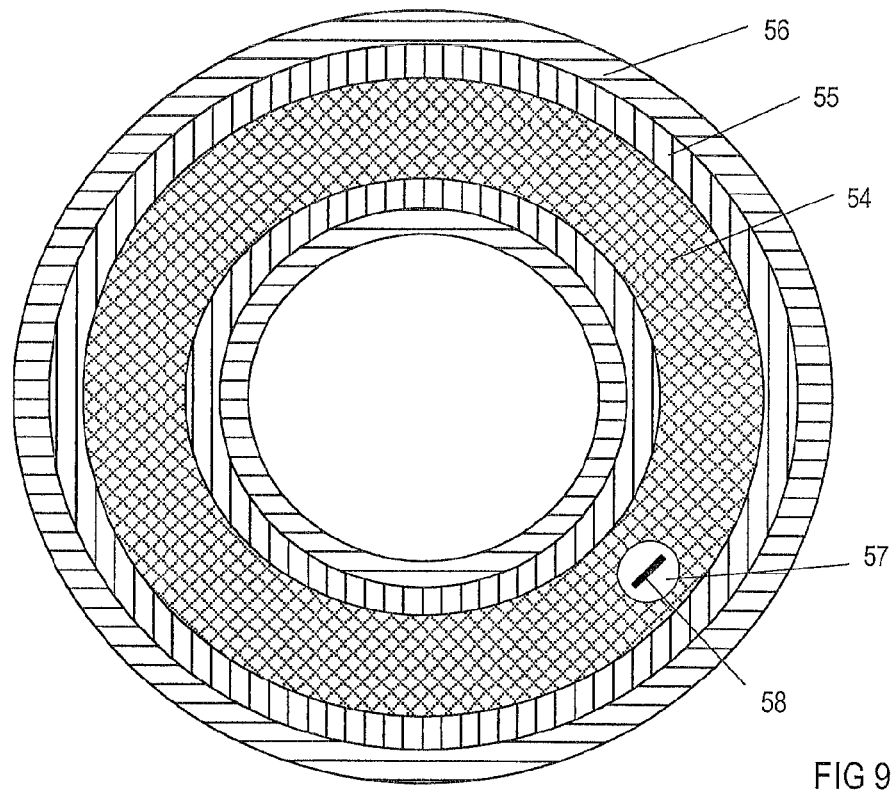
FIG. 9 depicts in a schematic illustration a ring-shaped magnetic core for use in the compensation current sensor depicted in FIG. 1.

FIG. 9 depicts an example of a round, ring-shaped, enclosed magnetic core 54, which can be used instead of the rectangular, ring-shaped, enclosed magnetic core 5 used in the example according to FIG. 1. Magnetic core 54 is completely wrapped by a first compensation winding 55, on which is then wrapped also in its full circumference a second compensating winding 56. Alternatively, the two compensation windings 55 and 56 may also be wrapped into each other or wrapped alternatingly in sections. Magnetic core 54 has a recess 57, housing a magnetic field sensor 58, that is over-wrapped by the two compensation windings 55 and 56 when magnetic field sensor 58 is inserted in recess 57.

Figure 10:
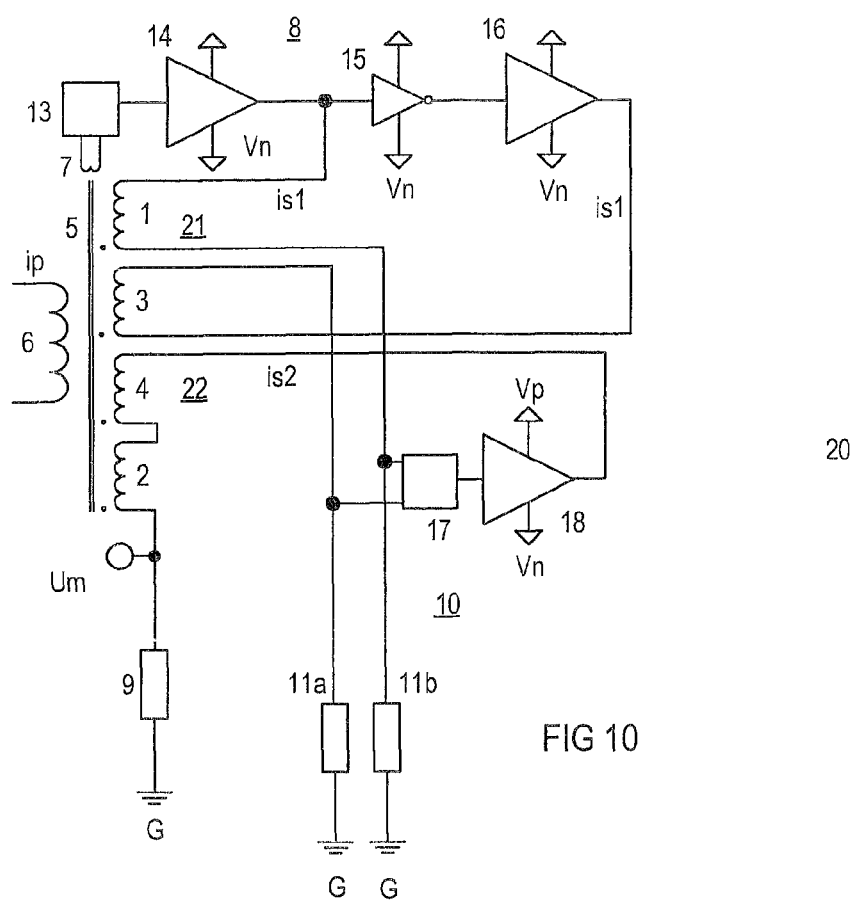
FIG. 10 depicts in a wiring diagram a fifth sample design of the compensation current sensor according to FIG. 1 with a driver in a full bridge circuit and two measurement resistors leading to a ground and each switched in pairs between two partial windings of the first secondary winding and a half-bridge with a measurement resistor for the second compensation winding.

Based on the example depicted in FIG. 3, the circuit of the compensation current sensor shown in FIG. 10 has been changed to the effect that resistor 11 is designed as a resistor-pair with identical resistors 11a, 11b, which are led on the one hand to ground G and on the other are each connected to a connection of windings 1 and 3. The other connection of winding 1 is connected to the output of driver amplifier 14, the other connection of winding 3 is connected to the output of driver amplifier 16, the other connection of winding 4 is connected to the output of driver amplifier 18, and the other connection of winding 2 is connected to resistor 9 that is also led to ground G. The connections wired with resistors 11a, 11b are the facing connections of windings 1 and 3, so that here the wiring of the first compensation winding 21 is similar to the wiring shown in FIG. 4 except that resistors 11 are so to say equipped with a tap placed at ground G. The tap is formed primarily by the node point of resistors 11a and 11b respectively. Accordingly, the corresponding voltages are taken across series circuits of resistors 11a and 11b.

The invention claimed is:

1. A current sensor arrangement capable of measuring a current in a primary conductor according to the compensation principle comprising:
    a magnetic core formed from a soft magnetic material, said magnetic core magnetically coupling a primary conductor, a first secondary winding and a second secondary winding together;
    said primary conductor configured to carry a primary current to be measured by said current sensor arrangement, said primary current creating a first magnetic flux in said magnetic core;
    a magnetic field sensor configured to detect and measure a magnetic flux in said magnetic core and to generate a signal based on said measured magnetic flux;
    a first evaluation circuit electrically connected between said magnetic field sensor and said first secondary winding, said first secondary winding being wound around said magnetic core in a manner to generate a first rectifying magnetic flux in said magnetic core compared to said first magnetic flux, said first evaluation circuit configured to receive said signal from said magnetic sensor and to generate a first compensation current that is proportional to said signal with said first compensation current passing from said first evaluation circuit to said first secondary winding, thereby creating said first rectifying magnetic flux in said magnetic core with said first rectifying magnetic flux reducing a net magnetic flux in said magnetic core to nearly zero;
    a second evaluation circuit electrically connected between said first secondary winding and said second secondary winding, said second secondary winding being wound around said magnetic core in a manner to generate a second rectifying magnetic flux in said magnetic core compared to said first magnetic flux, said second evaluation circuit configured to measure said first compensation current and to generate a second compensation current that is smaller than said first compensation current and proportional to it, said second compensation current passing to said second secondary winding thereby generating said second rectifying magnetic flux, a sum of said first and said second rectifying magnetic fluxes being sufficiently large enough to reduce said net magnetic flux in said magnetic core to zero; and
    wherein said first secondary winding is wound around said magnetic core with a turn number that is greater than a turn number of said second secondary winding; said first secondary winding and said second secondary winding each having a wire diameter such that a current density in said first secondary winding is equal to a current density in said second secondary winding when said first compensation current and said second compensation flow through them; and said first or said second compensation current represents said primary current to be measured flowing in said primary conductor.

2. The current sensor arrangement according to claim 1, wherein an output signal, which represents said primary current to be measured flowing in said primary conductor, is generated from said first or second compensation current.

3. The current sensor arrangement according to claim 1, wherein said first evaluation circuit and said second evaluation circuit each have a driver circuit which generates said first compensation current and said second compensation current in said first secondary winding and said second secondary winding, respectively.

4. The current sensor arrangement according to claim 3, wherein at least one of said driver circuits has an output-side half-bridge circuit.

5. The current sensor arrangement according to claim 3, wherein at least one of said driver circuits has an output-side full-bridge circuit.

6. The current sensor arrangement according to claim 3, wherein at least one of said driver circuits is a linear driver circuit.

7. The current sensor arrangement according to claim 3, wherein at least one of said driver circuits is a pulse width-modulated driver circuit.

8. The current sensor arrangement according to claim 3, wherein at least one of said driver circuits is a driver circuit supplied with bipolar supply voltages.

9. The current sensor arrangement according to claim 3, wherein at least one of said driver circuits behaves on its output side as a current source.

10. The current sensor arrangement according to claim 1, wherein said magnetic core is a round, enclosed, ring-shaped magnetic core with at least an air gap or a probe case.

11. The current sensor arrangement according to claim 1, wherein said magnetic core is a rectangular or polygonal, enclosed, ring-shaped magnetic core with at least four arms and at least an air gap or a probe case.

12. The current sensor arrangement according to claim 11, wherein an ampere-turns number is equal on each of said wrapped arms.

13. The current sensor arrangement according to claim 10, wherein the first compensation winding and the second compensation winding are wrapped in symmetrically arranged sections.

14. The current sensor arrangement according to claim 10, wherein said magnetic core is wrapped by said first secondary winding and said second secondary winding in an equally distributed manner over an entirety of said magnetic core.

15. The current sensor arrangement according to claim 13, wherein said first secondary winding and said second secondary winding are wrapped in each other.

16. The current sensor arrangement according to claim 13, wherein said first secondary winding and said second secondary winding are wrapped over each other.

17. The current sensor arrangement according to claim 1, wherein said second compensation current is at least 20 percent smaller than said first compensation current.

18. The current sensor arrangement according to claim 1, wherein said magnetic field sensor is housed in a recess in said magnetic core.

19. The current sensor arrangement according to claim 18, wherein said magnetic field sensor is located under said first secondary winding.

20. The current sensor arrangement according to claim 1, wherein said first compensation current is at least 1.5 times greater than said second compensation current.

* * * * *